(12) United States Patent
Baumann et al.

(10) Patent No.: US 6,664,025 B2
(45) Date of Patent: Dec. 16, 2003

(54) VISIBLE RADIATION SENSITIVE COMPOSITION

(75) Inventors: Harald Baumann, Osterode am Harz (DE); Michael Flugel, Osterode am Harz (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 135 days.

(21) Appl. No.: 10/074,791

(22) Filed: Feb. 12, 2002

(65) Prior Publication Data

US 2003/0180635 A1 Sep. 25, 2003

(51) Int. Cl.$^7$ .............................. G03F 7/027; C08F 2/46
(52) U.S. Cl. ............................. 430/281.1; 430/270.1; 430/325; 430/914; 430/915; 430/916; 430/926; 430/947; 522/25; 522/29; 522/114
(58) Field of Search ........................... 430/281.1, 270.1, 430/326, 914, 947, 915, 916, 926; 522/25, 29, 114

(56) References Cited

U.S. PATENT DOCUMENTS

| | | | |
|---|---|---|---|
| 4,069,054 A | 1/1978 | Smith | 430/270.1 |
| 4,175,963 A | 11/1979 | Crivello | 430/296 |
| 4,590,287 A | 5/1986 | Riediker et al. | 556/53 |
| 4,713,401 A | 12/1987 | Riediker et al. | 522/65 |
| 4,855,468 A | 8/1989 | Riediker et al. | 556/53 |
| 4,921,827 A | 5/1990 | Ali et al. | 502/167 |
| 4,960,746 A | 10/1990 | Hüsler et al. | 502/153 |
| 4,962,012 A | 10/1990 | Riediker et al. | 430/311 |
| 4,963,470 A | 10/1990 | Klingert et al. | 430/281 |
| 4,965,171 A | 10/1990 | Kawabata et al. | 430/288 |
| 4,971,892 A | 11/1990 | Ali et al. | 430/281 |
| 5,011,755 A | 4/1991 | Rohde et al. | 430/18 |
| 5,049,479 A | 9/1991 | Zertani et al. | 430/271 |
| 5,229,253 A | 7/1993 | Zertani et al. | 430/281 |
| 5,306,686 A * | 4/1994 | Patel et al. | 503/200 |
| 5,665,522 A * | 9/1997 | Vogel et al. | 430/278.1 |
| 5,731,363 A | 3/1998 | Okamoto et al. | 522/16 |
| 5,776,996 A | 7/1998 | Okamoto et al. | 522/26 |
| 6,051,359 A * | 4/2000 | Ohkawa et al. | 430/203 |
| 6,051,366 A | 4/2000 | Baumann et al. | 430/281.1 |

FOREIGN PATENT DOCUMENTS

EP 0 821 276 A1 1/1998

OTHER PUBLICATIONS

B.M. Monroe and G.C. Weed, "Photoinitiators for Free–Radical–Initiated Photoimaging Systems," *Chem. Rev.*, 93, pp. 435–448 (1993).
K. Meier, "Photopolymerization with Transition Metal Complexes," *Coord. Chem. Rev.*, vol. 111, pp. 97–110, Elsevier (1991).
J. Finter et al., "Photosensitive systems for Microlithography Based on Organometallic Photoinitiators," *Makro. chem. Macromol. Symp.*, 24, pp. 177–187 (1989).
M. Kawabata et al., "Photoinitiation Systems Comprised of Dyes and Radical Precursors," *J. Photopoly. Sci. & Tech.*, vol. 1, No. 2, pp. 222–227 (1988).
A. Roloff et al., "Industrial Applications of Organometallic Photochemistry," in *Photochemistry and Photophysics of Coordination Compounds*, H. Yersin and A. Vogler, Eds., Springer Verlag, vol. 5, pp. 317–322 (1987).
D. Eaton, "Dye Sensitized Photopolymerization," in *Adv. in Photochemistry*, D. Volman et al., Eds., Wiley–Interscience, New York, vol. 13, pp. 427–487 (1986).

* cited by examiner

*Primary Examiner*—Rosemary Ashton
(74) *Attorney, Agent, or Firm*—RatnerPrestia

(57) ABSTRACT

A visible radiation sensitive composition is disclosed. The composition comprises at least one ethylenically unsaturated monomer capable of free radical initiated addition polymerization; optionally, at least one binder; and a photoinitiator system comprising a coinitiator and a cyanopyridone sensitizer. The coinitiator preferably comprises a metallocene and an onium compound.

33 Claims, No Drawings

VISIBLE RADIATION SENSITIVE COMPOSITION

FIELD OF THE INVENTION

This invention relates to initiator systems for photosensitive compositions. In particular, this invention relates to a visible radiation sensitive composition comprising a cyanopyridone sensitizer.

BACKGROUND OF THE INVENTION

The use of photoinitiator systems to initiate photopolymerization is well known. When irradiated by actinic radiation, the photoinitiator system generates free radicals, which initiate polymerization of the monomer or monomers. The photoinitiator system may be a single compound that absorbs actinic radiation and forms the initiating radicals or it may consist of several different materials that undergo a complex series of reactions to produce radicals. Components that absorb actinic radiation and increase the efficiency of photoinitiation are known as sensitizers. Components that do not absorb actinic radiation but increase the efficiency of the photoinitiation are known as coinitiators.

Many of the well-known photoinitiator systems limit the applicability of photopolymerizable photosensitive compositions because they are activated only by ultraviolet radiation. The availability of reliable, relatively inexpensive visible lasers, which can be controlled by computer to expose the photopolymer system directly, eliminating the intermediate photomask, has made it desirable to develop photoinitiator systems that can be activated by visible radiation. From an economical point of view, it is also important that the photoinitiator system have high sensitivity to visible radiation so that low-intensity lasers, which are less expensive and more reliable than high-intensity lasers, can be used.

A large number of photoinitiator systems that are activated by visible radiation have been developed. Photoreducible dyes combined with various coinitiators have been widely studied, a useful discussion of which can be found in "Dye Sensitized Photopolymerization" by D. F. Eaton in *Adv. in Photochemistry*, Vol. 13, D. H. Volman, G. S. Hammond, and K. Gollinick, Eds., Wiley-Interscience, New York, 1986, pp. 427–487. However, many dye-sensitized systems undergo dark reactions and are not shelf stable.

Baumann, U.S. Pat. No. 6,051,366, discloses a visible radiation sensitive composition that comprises a binder, one or more polymerizable monomers, one or more dyes having an absorption range in the emission range of the radiation source, a metallocene, and an onium compound. The composition can be exposed by visible lasers and is especially suited for recording materials such as printing plates.

Despite the advances that have been made in visible sensitive photoinitiator systems, there is a continuing need for improved systems that have dark stability, low toxicity, efficient absorption, reasonable cost, and high photospeed.

SUMMARY OF THE INVENTION

In one aspect, the invention is a photosensitive composition. The composition comprises:
 at least one ethylenically unsaturated monomer capable of free radical initiated addition polymerization; and
 a photoinitiator system comprising a coinitiator and a sensitizer;
 in which:
  the photoinitiator system is present in an amount sufficient to initiate polymerization of the at least one monomer on exposure to actinic radiation;
  the sensitizer has an absorption maximum in the range of 400 nm to 700 nm; and
  the sensitizer is a cyanopyridone derivative selected from the group consisting of compounds of Formula I, Formula II, Formula III, Formula IV, and Formula V.

Preferably, the photosensitive composition additionally comprises a binder. Preferably, the coinitiator is a metallocene, more preferably a metallocene that comprises four aromatic ligands and titanium or zirconium as the metal atom. More preferably, the coinitiator comprises the metallocene and an onium salt.

In another aspect, the invention is an imageable element comprising a layer comprising the photosensitive composition and a support. In another aspect, the invention is a method for forming an image useful as a lithographic printing plate by exposing the imageable element with actinic radiation and developing the exposed imageable element. In another aspect, the invention is a lithographic printing plate prepared by exposing the imageable element with actinic radiation and developing the exposed imageable element.

The imageable elements exhibit high photospeed when they are exposed with visible radiation whose wavelength is greater than 400 nm (i.e. 400 nm to 700 nm), high capacity to resolve details (high resolution), and good shelf life. Lithographic printing plates formed from these elements have high durability on press.

DETAILED DESCRIPTION OF THE INVENTION

Unless the context indicates otherwise, in the specification and claims, the terms "monomer," "binder," "coinitiator," "metallocene," "onium compound," "sensitizer," "cyanopyridone derivative," "coating solvent," and similar terms also refer to mixtures of such materials. Unless otherwise indicated, percentages are expressed in percentage by weight (wt %).

Photosensitive Compositions

Negative working, photopolymerizable photosensitive compositions comprise at least one ethylenically unsaturated, free radical polymerizable monomer; at least one photoinitiator system; and, optionally and typically, at least one binder. Other ingredients that are conventional components of photopolymerizable photosensitive compositions may also be present. These compositions are generally described, for example, in "Photopolymers: Radiation Curable Imaging Systems," by B. M. Monroe, in *Radiation Curing: Science and Technology*, S. P. Pappas, Ed., Plenum, New York, 1992, pp. 399–440, and "Polymer Imaging" by A. B. Cohen and P. Walker, in *Imaging Processes and Material*, J. M. Sturge, et al., Eds., Van Nostrand Reinhold, New York, 1989, pp. 226–262.

Photoinitiator System

The composition comprises a photoinitiator system that comprises a coinitiator and a sensitizer. The sensitizer absorbs actinic radiation and causes the system to produce free radicals, which initiate polymerization of the polymerizable monomer.

The sensitizer is a cyanopyridone derivative that has an absorption maximum in the range of 400 nm to 700 nm and has a structure represented by Formula I, Formula II, Formula III, Formula IV, or Formula V:

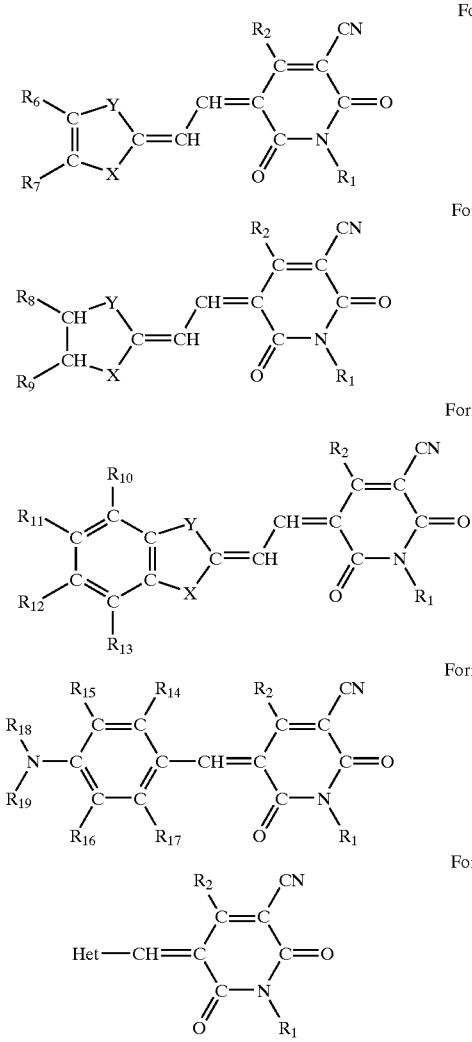

in which:
R$_1$ and R$_2$ are each independently hydrogen, or a substituted or unsubstituted alkyl, aryl or aralkyl group;
X is S or N(R$_3$);
Y is O, S, Se, N(R$_3$), or C(R$_4$)(R$_5$),
R$_3$, R$_4$, and R$_5$ are each independently a substituted or unsubstituted alkyl, aryl or aralkyl group;
R$_6$, R$_7$, R$_8$, and R$_9$ are each independently hydrogen, a substituted or unsubstituted saturated or unsaturated alkyl group, a substituted or unsubstituted aryl group, or a substituted or unsubstituted aralkyl group;
R$_{10}$, R$_{11}$, R$_{12}$, and R$_{13}$ are each independently hydrogen, a substituted or unsubstituted saturated or unsaturated alkyl group, a substituted or unsubstituted aryl group, or a substituted or unsubstituted aralkyl group, a substituted or unsubstituted amino group, a substituted or unsubstituted oxy group, or R$_{10}$ and R$_{11}$, R$_{11}$ and R$_{12}$, or R$_{12}$ and R$_{13}$ are joined to form a 5- or 6-membered substituted or unsubstituted ring;
R$_{14}$, R$_{15}$, R$_{16}$, and R$_{17}$ are each independently hydrogen, a substituted or unsubstituted alkyl group, a substituted or unsubstituted aryl group, a substituted or unsubstituted aralkyl group, halogen, carbalkoxy, a substituted or unsubstituted amino group, a substituted or unsubstituted oxy group, or R$_{14}$ and R$_{15}$, or R$_{16}$ and R$_{17}$ are joined to form a 5- or 6-membered substituted or unsubstituted ring;
R$_{18}$ and R$_{19}$ are each independently hydrogen, or a substituted or unsubstituted saturated or unsaturated alkyl group, a substituted or unsubstituted aryl group, or a substituted or unsubstituted aralkyl group, or R$_{18}$ and R$_{15}$ and/or R$_{19}$ and R$_{16}$ are joined to form a 5- or 6-membered substituted or unsubstituted ring, and
Het is a 5- or 6-membered substituted or unsubstituted heterocyclic ring residue.

Where substitution is possible, any of the aliphatic, aromatic, aralkyl, or heterocyclic groups present in the sensitizers may be substituted by any of the well-known organic substituents provided the presence of the substituents does not adversely affect the properties either of the sensitizer or of the photosensitive composition needed for the operation of the invention. These properties include, for example, the solubility, absorption spectrum, and stability of the sensitizer. In addition, the substituent should not cause the sensitizer to adversely affect the stability of the photosensitive composition in which it is present or adversely affect the photospeed of the photosensitive composition. Such substituents include for example: halogen, such as, for example, chloro, bromo, fluoro, and iodo; cyano; nitro; thiocyanato; alkoxy, such as, for example, methoxy, ethoxy, 2-ethoxyethoxy, and benzyloxy; aryloxy, such as, for example, phenoxy, 3-pyridyloxy, 1-naphthyloxy, and 3-theinyloxy; acyloxy, such as, for example, acetoxy, benzyloxy, and phenylacetoxy; aryloxycarbonyl, such as, for example, phenoxycarbonyl; alkoxycarbonyl, such as, for example, methoxycarbonyl; sulfonyl such as, for example, methanesulfonyl and p-toluenesulfonyl; carbamoyl, such as, for example, N-phenylcarbamoyl; acyl, such as, for example, benzoyl and acetyl; acylamido, such as, for example, p-toluenesulfonamido, benzamido, and acetamido; alkylamino, such as, for example, diethylamino, ethylbenzylamino, and i-butylamino; arylamino, such as, for example, anilino and diphenylamino. The aryl groups may also be substituted with substituted or unsubstituted alkyl groups, such as, for example, methyl, ethyl, cyclopentyl, 2-ethoxyethyl, benzyl, etc. The substituents typically have a total of 15 or fewer carbon atoms, more typically 11 or fewer carbon atoms. Up to three of the carbon atoms may be replaced by hetero atoms, such as oxygen, nitrogen, or sulfur.

Y is preferably O, S, N(R$_3$), or C(R$_4$)(R$_5$). Y is more preferably S or C(CH$_3$)$_2$.

In R$_1$, R$_2$, R$_3$, R$_4$, R$_5$, R$_6$, R$_7$, R$_8$, R$_9$, R$_{10}$, R$_{11}$, R$_{12}$, R$_{13}$, R$_{14}$, R$_{15}$, R$_{16}$, R$_{17}$, and R$_{18}$, the alkyl groups, aryl groups, and aralkyl groups each preferably contain 1 to 10 carbon atoms, such as pentyl, hexyl, octyl, decyl, naphthyl, phenyl, benzyl-, 2-phenylethyl-, and p-tolyl. More preferably these groups comprise 1 to 7 carbon atoms, and most preferably, they comprise 1 to 4 carbon atoms. These groups are preferably both saturated and unsubstituted. Preferred groups are methyl, ethyl, n-propyl, i-propyl, n-butyl, i-butyl, s-butyl, and t-butyl.

The heterocyclic group is typically a 5- or 6-membered heterocycle, such as oxazolyl, benzoxazolyl, thiazolyl, imidazolyl, pyridyl, pyrazinyl, pyrimidinyl, pyridazinyl, furyl, pyrazolyl, chromanyl or cumaryl. The heterocycle may be unsubstituted or substituted as described above.

In one preferred embodiment of the invention:
R$_1$ and R$_2$ are each independently selected from the group consisting of unsubstituted saturated alkyl groups of 1 to 4 carbon atoms;

X is S or N($R_3$);

Y is O, S, N($R_3$), or C($R_4$)($R_5$);

$R_3$, $R_4$, and $R_5$ are each independently selected from the group consisting of unsubstituted saturated alkyl groups of 1 to 4 carbon atoms;

$R_6$, $R_7$, $R_8$, and $R_9$ are each independently selected from the group consisting of hydrogen and unsubstituted saturated alkyl groups of 1 to 4 carbon atoms;

$R_{10}$, $R_{11}$, $R_{12}$, and $R_{13}$ each independently selected from the group consisting of hydrogen and unsubstituted saturated alkyl groups of 1 to 4 carbon atoms, or $R_{10}$ and $R_{11}$, $R_{11}$ and $R_{12}$, or $R_{12}$ and $R_{13}$ are joined to form a 6-membered substituted or unsubstituted aromatic ring;

$R_{14}$, $R_{15}$, $R_{16}$, and $R_{17}$ are each independently selected from the group consisting of hydrogen and unsubstituted saturated alkyl groups of 1 to 4 carbon atoms, or $R_{14}$ and $R_{15}$, or $R_{16}$ and $R_{17}$ are joined to form a 6-membered substituted or unsubstituted aromatic ring;

$R_{18}$ and $R_{19}$ each independently selected from the group consisting of hydrogen and unsubstituted saturated alkyl groups of 1 to 4 carbon atoms, or $R_{18}$ and $R_{15}$ and/or $R_{19}$ and $R_{16}$ are joined to form a 5- or 6-membered ring; and Het is a 5- or 6-membered heterocyclic ring residue selected from the group consisting of oxazolyl, benzoxazolyl, thiazolyl, imidazolyl, pyridyl, pyrazinyl, pyrimidinyl, pyridazinyl, furyl, pyrazolyl, chromanyl or cumaryl.

The preparation of the sensitizers from the corresponding pyridones is disclosed in F. Würthner, *Synthesis* 1999(12), 2103–2113. The absorption spectra for some these sensitizers are given in F. Würthner, R. Sens, K. -H. Etzbach and G. Seybold, *Angew. Chem.* 1999, 111(1), 1753–1756.

Coinitiator

A variety of compounds may be used as the coinitiator. These include, for example, metallocenes, halo-alkyl substituted S-triazines, peroxides, 2,4,5-triarylimidazolyl dimers (HABI's) such as are disclosed in Dueber, U.S. Pat. No. 4,565,769, onium salts, oxime ethers, oxime esters, N-phenyl glycine and derivatives of N-phenyl glycine, anilinodiacetic acid and derivatives thereof such as are disclosed in West, U.S. Pat. No. 5,629,354, and thiols such as mercaptobenzthiazole, mercaptobenzimidazole, mercaptotriazole.

A preferred class of coinitiators are metallocenes. Metallocenes of elements of subgroup IV of the periodic table, in particular metallocenes comprising titanium or zirconium, are disclosed in EP-A-119 162, EP-A-186 626, EP-A-242 330, EP-A-255 486, EP-A-256 981 and EP-A-269 573. Especially suitable titanocenes are disclosed e.g. in EP-A-122 223. Metallocenes are also disclosed in McGinniss, U.S. Pat. No. 3,717,558; Riediker, U.S. Pat. No. 4,590,287; and Husler, U.S. Pat. No. 5,106,722.

Preferred metallocenes are those having a titanium or zirconium atom as the metal atom and additionally having four aromatic ligands. More preferred are those in which two ligands are substituted or unsubstituted cyclopentadienyl groups and two ligands are substituted phenyl groups. Most preferred is a metallocene wherein the substituted phenyl groups contain halogen atoms. Preferred phenyl groups are those that comprise at least one fluorine in the o-position and which can furthermore be substituted by halogen atoms, alkyl or alkoxy groups with 1 to 4 carbon atoms and/or an optionally etherified or esterified polyoxyalkylene group. When present, the polyoxyalkylene group generally has 1 to 6 oxyalkylene units. Preferred metallocenes include bis (cyclopentadienyl)-bis-{2,6-difluoro-3-(pyrr-1-yl)-phenyl}-titanium, bis (cyclopentadienyl)-bis-(pentafluorophenyl)-titanium, and dicyclopentadienyl-bis-pentafluorophenyl-zirconium.

Onium salts may be used as coinitiators. Onium salts are disclosed, for example, in Brown-Wensley, U.S. Pat. No. 5,086,086. Preferred onium salts include those in which the onium cation is iodonium, sulphonium, phosphonium, oxysulphoxonium, oxysulphonium, sulphoxonium, ammonium, diazonium, selononium, arsonium, or N-substituted N-heterocyclic onium in which N is substituted with a substituted or unsubstituted saturated or unsaturated alkyl or aryl group.

The anion of the onium salt may be, for example, chloride, or a non-nucleophilic anion such as tetrafluoroborate, hexafluorophosphate, hexafluoroarsenate, hexafluoroantimonate, triflate, tetrakis-(pentafluorophenyl) borate, pentafluoroethyl sulfonate, p-methyl-benzyl sulfonate, ethyl sulfonate, trifluoromethyl acetate, and pentafluoroethyl acetate.

Typical onium salts include, for example, diphenyl iodonium chloride. diphenyliodonium hexafluorophosphate, diphenyl iodonium hexafluoroantimonate, 4,4'-dicumyliodonium chloride, 4,4'-dicumyliodonium hexofluorophosphate, N-methoxy-a-picolinium-p-toluene sulfonate, 4-methoxybenzene-diazonium tetrafluoroborate, 4,4'-bis-dodecylphenyliodonium-hexafluoro phosphate, 2-cyanoethyl-triphenylphosphonium chloride, bis-[4-diphenylsulfoniophenyl]sulfide-bis-hexafluoro phosphate, bis4-dodecylphenyliodonium hexafluoroantimonate, and triphenylsulfonium hexafluoroantimonate.

Haloalkyl-substituted s-triazines are s-triazines substituted with 1 to 3 $CX_3$ groups in which is X is bromo or, preferably, chloro. These compounds are disclosed, for example, in Smith, U.S. Pat. No. 3,779,778. Examples include 2-phenyl4,6-bis(trichloromethyl)-s-triazine, 2,4,6-tris(trichloromethyl)-s-triazine, 2-methyl-4,6-bis (trichloromethyl)-s-triazine, 2-(styryl-4,6-bis (trichloromethyl)-s-triazine, 2-(p-methoxystyryl)4,6-bis (trichloromethyl)-s-triazine, 2-(4-methoxy-naphtho-1-yl)4, 6-bis-trichloromethyl-s-triazine, 2-(4-ethoxy-naphtho-1-yl)-4,6-bis-trichloromethyl-s-triazine, and 2-[4-(2-ethoxyethyl)-naphtho-1-yl]-4,6-bis-trichloromethyl-s-triazine).

The coinitiator may be used in combination with one or more other coinitiators. A preferred combination is the combination of a metallocene with a second coinitiator. A more preferred combination is the combination of a metallocene, preferably a metallocene that comprises titanium or zirconium as the metal atom, with an onium salt.

Monomers

The composition contains at least one ethylenically unsaturated compound that undergoes free-radical initiated addition polymerization, generally known as a monomer. The composition contains at least one such material and may contain a mixture of such materials. The monomers are typically multifunctional, i.e., they comprise more than one ethylenically unsaturated, free radical polymerizable group. In general, preferred monomers for these applications have boiling points greater than 100° C., more preferably, greater than 150° C.

Numerous unsaturated monomers, oligomers, and prepolymers polymerizable by free-radical initiated addition polymerization and useful in photosensitive compositions are known in the art. Typical multifunctional monomers are unsaturated esters of alcohols, preferably acrylate and methacrylate esters of polyols, such as, trimethylol propane tri- and tetra-acrylate and methacrylate, the tri- and tetra-acrylate and methacrylate esters of ethoxylated trimethylolpropane, diethylene glycol diacrylate and dimethacrylate, triethylene glycol diacrylate and dimethacrylate, tetraethylene glycol diacrylate and dimethacrylate, polyethylene glycol diacrylate and dimethacrylate, glycerol tri-acrylate and tri-methacrylate, ethylene glycol dimethacrylate, pentaerythritol tri- and tetra-acrylate and methacrylate, dipentaerythrol penta- and hexa-acrylate and methacrylate, tripropylene glycol diacrylate and dimethacrylate, the di-(2-acryloxyethyl)ether and the di-(2-methacryloxyethyl)ether of bisphenol A, ethoxylated bisphenol A diacrylate and dimethacrylate, 1,6-hexanediol diacrylate and dimethacrylate, neo-pentyl glycol diacrylate and dimethacrylate, and butanediol diacrylate and dimethacrylate. Monofunctional monomers, which are sometimes used in combination with multifunctional monomers include, for example, 2-hydroxyethyl methacrylate, 2-hydroxypropyl methacrylate, 2-ethoxyethyl acrylate and methacrylate, 2-(2-ethoxyethoxy)ethyl acrylate and methacrylate, 2-ethylhexyl acrylate and methacrylate, octyl acrylate and methacrylate, lauryl acrylate and methacrylate, 2-phenoxyethyl acrylate and methacrylate, benzyl acrylate and methacrylate, iso-bornyl acrylate and methacrylate, phenyl acrylate and methacrylate, 2-phenylethyl acrylate and methacrylate, and tetrahydrofurfuryl acrylate and methacrylate. Other monomers include, for example, unsaturated amides, such 1,6-hexamethylene bis-acrylamide, vinyl esters such as divinyl succinate, divinyl phthalate, and divinyl benzene-1,3-disulfonate, styrene, divinyl benzene, and derivatives thereof, and N-vinyl compounds, such as N-vinyl pyrrolidone and N-vinyl carbazole. Oligomers and/or prepolymers, such as urethane acrylate and methacrylate, epoxide acrylate and methacrylate, polyester acrylate and methacrylate, polyether acrylate and methacrylate or unsaturated polyester resins, may also be used.

Binders

The binder is an optional component present in the preferred compositions of the invention. The binder is a preformed macromolecular polymeric or resinous material. In general, the binder should be soluble, or at least swellable, in the coating solvent and compatible with the other components of the photosensitive system.

Numerous binders useful in photosensitive compositions are known. Representative binders include, for example, poly(methyl methacrylate) and polymers and copolymers of alkyl acrylates such as methyl acrylate, and/or alkyl methacrylates such as methyl methacrylate with methacrylic acid, and/or acrylic acid; poly(vinyl acetate) and its partially hydrolyzed derivatives; polyvinyl acetals; polyurethanes; gelatin; cellulose esters and ethers, such as cellulose acetate butyrate; and polyethylene oxides. Numerous other binders are known to those skilled in the art. Representative binders are listed in Ishikawa, U.S. Pat. No. 4,481,276.

For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used to advantage.

For the preparation of imageable elements useful as lithographic printing plate precursors, the binder is preferably selected from the group consisting of polyvinyl acetals, acrylics and polyurethanes. The binder preferably comprises acidic groups. The most preferred acid group is a carboxylic acid group. The most preferred binder is an acrylic binder with an acid number in the range of 20 to 180 mg KOH/g. Optionally, the binder may comprise unsaturated groups capable of undergoing free radical photopolymerization reaction or other photoreactions, such as 2+2-photocycloaddition, in the main chain or in a side chain.

Other Ingredients

Other components conventionally added to photosensitive compositions can be present to modify the physical properties of the photosensitive layer. Such components include, for example: chain transfer agents, plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the photosensitive layer in a conventional fashion. When a binder is present, a plasticizer would be selected which is compatible with the binder as well as the monomer and other components of the composition. Suitable plasticizers include dibutyl phthalate, dioctyl phthalate, didodecyl phthalate, dioctyl adipate, dibutylsebacate, triacetyl glycerine, and tricresyl phosphate. When present, the amount of plasticizer used is preferably 0.25 to 10 wt %.

The composition may comprise a small amount of a polymerization inhibitor to inhibit polymerization of the monomer during preparation and storage of the composition. Suitable polymerization inhibitors include, for example, hydroquinone, p-methoxyphenol, di-t-butyl-p-cresol, pyrogallol, t-butyl catechol, benzoquinone, 4,4'-thio-bis-(3-methyl-6-t-butylphenol), 2,2'-methylene-bis-(4-methyl-6-t-butylphenol) and N-nitrosophenylhydroxylamine salts. When present, the amount of the thermal polymerization inhibitor used is preferably from 0.01 wt % to about 5 wt % based on the weight of the entire composition.

Surfactants may be added to the photosensitive composition as coating aids. Typical coating aids are polyethylene oxides, such as Polyox® WSRN.

Depending on the application, other inert additives can be added such as dyes, pigments and fillers. A dye or pigment may also be added to color the imageable layer. Examples of the coloring agents include pigments such as phthalocyanine-based pigment, azo-based pigment, carbon black and titanium oxide, Ethyl Violet, Crystal Violet, azo-based dyes, anthraquinone-based dyes and cyanine-based dyes. The amount of dyestuff or pigment added is preferably from 0.5 to about 10 wt % based on the entire composition. The coloring agent should not absorb strongly at the wavelength of the radiation used for imaging. These additives are generally present in minor amounts so as not to interfere with the exposure of the photosensitive composition.

Composition

While the composition of the photosensitive composition will depend on the intended application, typical compositions are, by weight, binder(s) 0 to 90%, preferably 10 to 60%; monomer(s), 5 to 80%, preferably, 15 to 70%; photoinitiator system, 0.01 to 15%, preferably 0.1 to 12%; more preferably 0.5 to 8%; and other ingredients, 0 to 20%, typically 0 to 10%. In general, when a binder is present, the binder should be at least about 25 wt % and the monomer should not exceed about 80 wt %, based on the weight of the composition.

The amount of sensitizer present depends on the intended use, the wavelength(s) of actinic radiation used for exposure, the absorption spectrum of the sensitizer, and the thickness of the layer of photosensitive composition. As described by Thommes and Webers, *J. Imag. Sci.*, 29, 112 (1985), an optical density of 0.43 produces efficient photopolymerization for systems that are developed by washout, such as photoresists. It is also generally preferred that the absorption maximum of the sensitizer be matched to the intensity maximum of the source of actinic radiation. In general, the sensitizer will comprise, by weight, about 0.01% to about 3.0% preferably about 0.05% to about 2.0% of the composition.

Imageable Elements

The imageable element comprises a layer of the photosensitive composition over an appropriate substrate.

The photosensitive composition may be coated onto a wide variety of substrates. By "substrate" is meant any natural or synthetic support, preferably one that is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. The photosensitive compositions are especially suited for use in the production of lithographic printing plates and in the field of photoresist technology.

For photoresist applications, the substrate may be a polymer sheet or film, such as a polyethylene terephthalate film. The photosensitive composition is coated or laminated onto the polymer film. While the thickness of the layer will depend on the intended application, for dry film photoresists the coating should have a thickness of about 0.2 to 4 mil (5 to 100 microns), preferably 0.5 to 2 mil (13 to 50 microns), when dry. For protection, a release film, such as polyethylene or polypropylene, may be placed over the layer of photosensitive composition after the solvent evaporates.

After removal of the release film, the layer of photosensitive composition is laminated to a printed circuit board precursor, typically a layer of copper on a dielectric support. The substrate is typically left in place as an oxygen barrier during imaging. Alternatively, if the resist is a liquid photoresist, i.e., one that comprises little or no binder, it may be applied directly to the printed circuit board precursor.

For lithographic printing, the substrate comprises a support, which may be any material conventionally used to prepare imageable elements useful as lithographic printing plates, with at least one hydrophilic surface. The layer of photosensitive material is over the hydrophilic surface. Typically the coating weight of the layer of photosensitive material is about 0.5 to about 4 g/m$^2$, preferably 0.8 to 3 g/m$^2$.

The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 μm. Typically, the substrate comprises an interior between the aluminum support and the top layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The backside of the substrate (i.e., the side opposite the layer of photosensitive material) may be coated with an antistatic agent and/or a slipping layer or matte layer to improve handling and "feel" of the photosensitive element.

For many applications, such as for lithographic printing applications, it is advantageous to overcoat the layer of photosensitive material with an oxygen-impermeable layer that is soluble in the developer and transparent to to the actinic radiation used for imaging. The overcoat protects the layer of photosensitive material from damage during production and handling and acts as an oxygen barrier layer during imaging.

Overcoats are described in WO 99/06890. Preferred binders for the overcoat are water-soluble polymers such as polyvinyl alcohol, polyvinyl alcohol/polyvinyl acetate copolymers, polyvinyl pyrolidone, vinyl pyrolidone/vinyl acetate copolymers, polyvinyl methyl ether, ring-opened copolymers of maleic anhydride and co-monomers such as methyl vinyl ether, polyacrylic acid, gelatine, and cellulose ethers. Most preferred is polyvinyl alcohol.

To improve the adhesion of the overcoat to the layer of photosensitive material, an adhesion promoter can be added to the overcoat formulation. One example for such an adhesion promoter is poly(vinyl imidazole) as disclosed in WO 99/06890. The coating weight of the overcoat is preferably 0.1 to 6 g/m$^2$, and more preferably 0.5 to 4 g/m$^2$.

Preparation of the Imageable Elements

The imageable elements may be prepared by conventional methods, e.g. as described in EP-A-445 624. The components of the photosensitive composition are taken up in a coating solvent, and the resulting solution or dispersion is applied to the substrate by pouring, spraying, immersing, coating, etc, and the resulting layer dried to remove the coating solvent. For example, in photoresist applications, the photosensitive composition may be quickly and efficiently coated onto polymer films using continuous web coating techniques. Typical coating solvents are acetone, methyl ethyl ketone, cyclohexane, ethyl acetate, tetrahydrofuran, toluene, ethylene glycol monomethyl ether, ethylene glycol dimethyl ether, propylene glycol monomethyl ether, acetylacetone, cyclohexanone, diacetone alcohol, ethylene glycol monomethyl ether acetate, ethylene glycol monoethyl ether acetate, ethylene glycol monoisopropyl ether acetate, ethylene glycol monobutyl ether acetate, 3-methoxypropanol, methoxymethoxyethanol, diethylene glycol monomethyl ether, diethylene glycol monoethyl ether, propylene glycol monomethylether acetate, propylene glycol monoethylether acetate, 3-methoxypropyl acetate, N,N-dimethylformamide, dimethyl sulfoxide, γ-butyrolactone, methyl lactate, and ethyl lactate. These solvents may be used individually or in combinations. The solid content of the coating solution is typically about 1 to about 50 wt %.

After the layer of photosensitive material has been dried, a release film, typically a polyethylene or polypropylene film, may be adhered to the layer of photosensitive material. Alternatively, an overcoat may be applied to the layer of photosensitive material. The overcoat is typically coated from aqueous solution.

Imaging and Processing

Any convenient source or sources of actinic radiation providing wavelengths in the region of the spectrum that overlap the absorption bands of the sensitizer can be used for imaging. "Actinic radiation" means radiation that is active to produce the free-radicals necessary to initiate polymerization of the monomer(s) in the photosensitive composition. The radiation can be natural or artificial, monochromatic or polychromatic, incoherent or coherent, and for high efficiency should correspond closely in wavelength to the absorption of the photoinitiator system. Conventional light sources include fluorescent lamps, mercury, metal additive and arc lamps. Coherent light sources are helium, cadmium, helium-neon lasers, xenon, argon ion, and krypton ion, as well as tunable dye lasers, semiconductor lasers, solid state lasers such as the ruby laser, and the frequency doubled neodymium:YAG laser, whose emissions fall within or overlap the visible absorption bands of the sensitizer. For the exposure of holographic photopolymer systems, coherent light sources, i.e., lasers, are required.

The photosensitive compositions are especially suited for direct exposure by a computer-controlled laser, eliminating need for preparation of an intermediate photomask. For lithographic printing plate precursors, imaging is preferably carried out with the argon ion laser (488 nm) or the FD-Nd-YAG laser (532 nm).

Following imaging, the photosensitivity of the layer of photosensitive material can be increased by briefly heating the imaged element to about 60° C. to about 180° C. prior to the developing step.

Imaging produces an imaged element, which comprises a latent image of imaged (unexposed) regions and non-imaged (exposed) regions. Development of the imaged element converts the latent image to an image by removing the unexposed regions. For holographic applications, a development step is typically not necessary.

Developers for photoimageable elements comprising photopolymerizable photosensitive compositions are well known. Development may be carried out, for example, with organic solvents. However, slightly alkaline aqueous solutions are preferred. Aqueous developers may also comprise minor amounts (0.5 wt % to about 15 wt %, based on the weight of the developer, preferably between about 3 wt % and about 5 wt %, based on the weight of the developer) of water-miscible organic solvents. The following solvents and mixtures of these solvents are suitable for use in the developer: the reaction products of phenol with ethylene oxide and propylene oxide, such as ethylene glycol phenyl ether; benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethylethanol and 2-butoxyethanol.

Other conventional additives such as wetting agents, dyes or salts may also be present. Preferred surfactants include: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A preferred alkali metal is sodium. The developer may also comprise a buffer system to keep the pH relatively constant, typically between about 5.0 and about 13.0, preferably between about 7.0 and about 12.0, more preferably between about 8.0 and about 12.0. Filter dyes or mixtures of filter dyes that absorb in the same region as the sensitizer, such as metanil yellow (C.I. 13065) and other similar water soluble azo dyes, and/or free radical inhibitors, such as those that contain the quinone or hydroquinone moieties, for example benzoquinone, hydroquinone, 4-methoxyphenol, 2,6-di-t-butyl-4-methylphenol, may be added to the developer to prevent the formation of sludge during processing.

Typically the developer is applied to the imaged element by rubbing or wiping the imageable layer with an applicator containing the developer. Alternatively, the imaged element may be brushed with the developer or the developer may be applied to the element by spraying the imageable layer with sufficient force to remove the exposed regions. In either instance, a developed element is produced. Development may be carried out in a commercial processor, such as the MercuryNews Processor (Kodak Polychrome Graphics), Sprinter 72 (Kodak Polychrome Graphics), and PC 85 (Unigraph Ltd.).

Following development, the imaged and developed element is typically rinsed with water and dried. Drying may be conveniently carried out by infrared radiators or with hot air.

The developed element comprises (1) regions in which the imageable layer has been removed in the unexposed regions substrate, and (2) complimentary exposed regions in which the layer or layers have not been removed. If the imageable element is a printing plate precursor, development reveals the hydrophilic surface of the underlying substrate. The regions of the layer or layers that have not been removed are ink receptive and correspond to the regions that were not exposed during imaging.

Printing may be carried out by applying a fountain solution and then a lithographic ink to the image on the surface of the element. The fountain solution is taken up by the surface of the hydrophilic substrate revealed by the imaging and development process, and the ink is taken up by the exposed regions of the layer of photosensitive layer that remain after the development process. The ink is then transferred to a suitable receiving material (such as cloth, paper, metal, glass or plastic) either directly or indirectly through the use of an offset printing blanket to provide a desired impression of the image thereon. The imaging members can be cleaned between impressions, if desired, using conventional cleaning means.

Industrial Applicability

The photosensitive compositions show good visible light sensitization and photospeed, which allows them to be exposed with a variety of visible light sources, especially visible lasers. The broad sensitization range coupled with the effectiveness of the sensitization enables polymeric images, which may be further processed by development to produce resist images or other relief images, to be formed. They are particularly suited for the production of imageable elements useful as lithographic printing plate precursors. In addition, these compositions are useful for letterpress and flexo printing plates, engineering drafting films, as well as photoresists in liquid or dry film form for making printed circuits, in chemical milling, or in solder masks. They may be also useful for the formation of holograms, such as are disclosed in Keys, U.S. Pat. No. 4,942,102; Monroe, U.S. Pat. No. 4,942,112; Smothers, U.S. Pat. No. 4,959,284; and Trout, U.S. Pat. No. 4,963,471, in which sensitivity to visible lasers is required. Other specific uses will be evident to those skilled in the art.

The advantageous properties of this invention can be observed by reference to the following examples, which illustrate but do not limit the invention.

EXAMPLES

| | Glossary |
|---|---|
| AIRVOL® 203 | Poly (vinyl alcohol), about 88% hydrolyzed (Air Products, Allentown, PA, USA) |
| Copolymer A | Terpolymer produced by polymerization of 476 parts styrene, 476 parts methyl methacrylate and 106 parts methacrylic acid |
| Dispersion A | Dispersion of 7.25 wt % of copper phthalocyanine and 7.25 wt % of a polyvinylacetal binder containing 39.9 mol % vinyl alcohol, 1.2 mol % vinylacetate, 15.4 mol % acetal groups from acetaldehyde, 36.1 mol % acetal groups from butyraldehyde and 7.4 mol % acetal groups from 4-formylbenzoic acid in propylene glycol mono methyl ether |
| JONCRYLI® 683 | Acrylic resin, acid number 150 (S. C. Johnson, Racine WI, USA) |
| NEKAL® BX Paste | Sodium alkyl naphthalene sulfonate (BASF, Ludwigshafen, Germany) |
| REWOPOL® NLS 28 | 30 wt % solution of sodium lauryl sulfate in water (REWO Chemicals, Widnes, Cheshire, UK) |
| TEXAPON® 842 | 42 wt % solution of sodium octyl sulfate in water (Henkel, Düsseldorf, Germany) |
| Urethane Acrylate | 80% methylethylketone solution of an urethane acrylate obtained by reacting DESMODUR ® N100 (Bayer, Leverkusen, Germany) and hydroxyethyl acrylate and pentaerythrol triacrylate with a double bond content of 0.5 double bonds per 100 g after completion of the reaction of the isocyanate groups |

Examples 1–3 and Comparative Examples 1–7

These examples illustrate the preparation and evaluation of compositions of the invention and the preparation and evaluation of comparative compositions in lithographic printing plate precursors. Sensitizers 1 to 3 were prepared by coupling the corresponding thiazole or indoline with the corresponding 3-cyano-6-hydroxy-pyrid-2-ones in dimethylformamide/acetanhydride following the general procedure of F. Würthner, Synthesis 1999(12), 2103–2113.

A series of ten coating solutions was prepared by dissolving each of the sensitizers indicated in Table 1, in the amount of dye indicted in Table 1, in a mixture that contained: 0.56 g of Copolymer A, 0.56 g of JONCRYLI® 683, 0.1 g of mercapto3-trizol, 3.37 g of Urethane Acrylate, 0.38 g di(methylolpropane) tetra-acrylate, 2.50 g of Dispersion A, 0.115 g of bis(cyclopentadienyl)-bis-[2,6-difluoro-3-(pyrr-1-yl)-phenyl]-titanium (Ciba Geigy), 0.16 g of diphenyl iodonium chloride, 20 mL of methyl ethyl ketone, 1.5 mL of methanol, and 17.5 mL of methyl glycol.

Each coating solution was filtered and coated onto electrochemically roughened and anodized 0.03 mm thick aluminum foil that had been treated with an aqueous solution of polyvinyl phosphonic acid. The resulting element, consisting of an imageable layer on a support, was dried for 4 min at 90° C. The coating weight of the imageable layer was about 2 g/m$^2$.

To produce the imageable elements or printing plate precursors, each imageable layer was overcoated with an aqueous solution of AIRVOL® 203 and dried at 90° C. for 4 min. The topcoat layer had a coating weight of about 3g/m$^2$.

Absorption maxima of the sensitizers, measured in the imageable layer, were:

Sensitizer 1=527 nm;

Sensitizer 2=530 nm;

Sensitizer 3=545 nm;

Sensitizer 4=495 nm;

Sensitizer 5=503 nm;

Sensitizer 6=506 nm;

Sensitizer 7=520 nm;

Sensitizer 8=560 nm;

Sensitizer 9=530 nm;

Sensitizer 10=518 nm.

Exposure was carried out through a silver film halftone step wedge having a tonal range of 0.15 to 1.95 with density increments of 0.15 (UGRA scale). A sample of each precursor was exposed for 60 sec with 488 nm radiation from a tungsten lamp. An additional sample was exposed with 532 nm radiation from the tungsten lamp. Metal interference filters for 488 nm and 532 nm were used. After exposure each exposed printing plate precursor was immediately heated in an oven to about 90° C. for 2 min.

Each exposed printing plate precursor was treated for 30 seconds with a developer solution consisting of: 3.4 parts by weight REWOPOL® NLS 28, 1.1 parts by weight diethanol amine, 1.0 parts by weight TEXAPON® 842, 0.6 parts by weight NEKAL® BX Paste, 0.2 parts by weight 4-toluene sulfonic acid, and 93.7 parts by weight water. Then the developer was rubbed over the surface of the precursor for another 30 sec using a tampon, and each exposed and developed element rinsed with water. This process removed the unexposed regions of the imageable layer, leaving the exposed regions.

To assess photosensitivity, each exposed and developed element was blackened in a wet state using a printing ink. After the ink dried, the number of solid steps accepting ink and the first step that did not accept ink were recorded.

The results are shown in Table 1.

TABLE 1

| Example | Sensitizer | Amount (g) | Grey scale - 488 nm[a] | Grey scale - 532 nm[b] | Resolution[c] |
|---|---|---|---|---|---|
| 1 | 1 | 0.030 | 2/5 | 4/8 | 4/30 |
| 2 | 2 | 0.030 | 1/4 | 4/9 | 4/30 |
| 3 | 3 | 0.032 | 2/4 | 4/8 | 4/30 |
| Comparative 1 | 4 | 0.027 | 3/5 | 2/6 | 12/30 |
| Comparative 2 | 5 | 0.022 | 2/4 | 1/4 | 30/20 |
| Comparative 3 | 6 | 0.024 | 2/5 | 4/8 | 6/40 |
| Comparative 4 | 7 | 0.023 | 2/4 | 4/7 | 6/40 |
| Comparative 5 | 8 | 0.028 | 2/8 | 3/9 | 6/70 |
| Comparative 6 | 9 | 0.023 | 1/2 | 1/4 | 25/25 |
| Comparative 7 | 10 | 0.028 | 2/8 | 4/9 | 4/70 |

[a]First value is the solid steps of the inked grayscale and the second value is the first step taking no ink when exposure was carried out at 488 nm.
[b]First value is the solid steps of the inked grayscale and the second value is the first step taking no ink when exposure was carried out at 532 nm.
[c]First value is the smallest resolved micro line and the second value is the smallest resolved micro gap of an inked plate.

To prepare a lithographic plate, an imageable element was prepared as described above, exposed, heated, and developed. After the element had been rinsed with water, it was wiped and rubbed with an aqueous solution of 0.5% phosphoric acid and 6% gum arabic.

To assess shelf life, each unexposed element was stored for 5 days in a climate chamber at 40° C. and 80% relative humidity (r.h.) and then exposed and processed as above described. Each of the resulting plates was loaded in a sheet-fed offset printing machine using abrasive ink (Offset S 7184 available from Sun Chemical which contains 10% of potassium carbonate).

The results are shown in Table 2.

Sensitizer 1
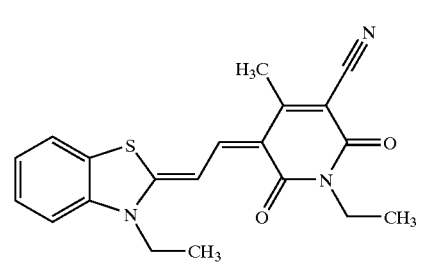

Sensitizer 2
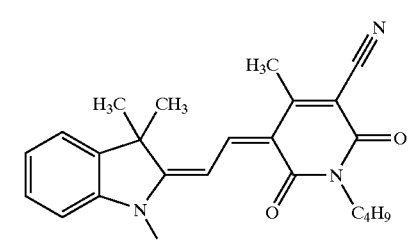

Sensitizer 3
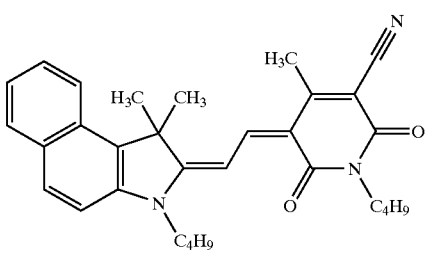

Sensitizer 4
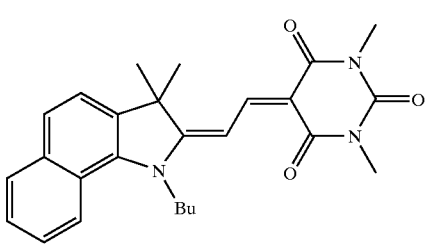

Sensitizer 5
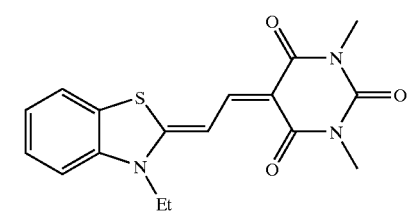

-continued

Sensitizer 6
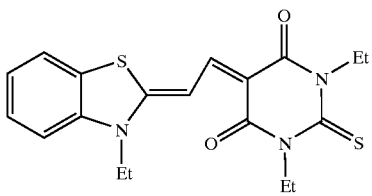

Sensitizer 7
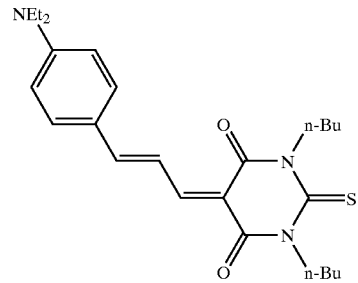

Sensitizer 8
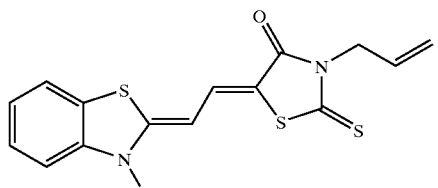

Sensitizer 9
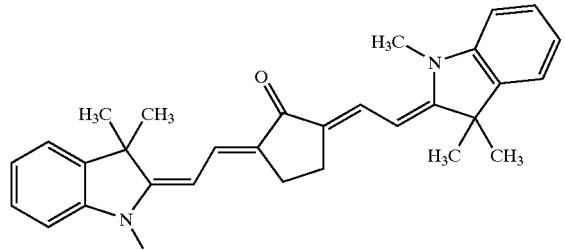

Sensitizer 10
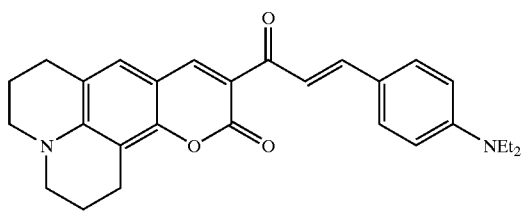

TABLE 2

| Example | Shelf life test | Print results[a] |
|---|---|---|
| 1 | Plates stored for 5 days at 40° C. and 80% r.h. exhibit good developability; Photospeed shows little change compared to fresh plates | Plate shows little wear |
| 2 | Plates stored for 5 days at 40° C. and 80% r.h. exhibit good developability; Photospeed shows little change compared to fresh plates | Plate shows little wear |
| 3 | Plates stored for 5 days at 40° C. and 80% r.h. exhibit good developability; Photospeed shows little change compared to fresh plates | Plate shows little wear |
| Comparative 1 | Plates stored for 5 days at 40° C. and 80% r.h. exhibit good developability; Photospeed shows little change compared to fresh plates | Plate shows wear in solid areas |

TABLE 2-continued

| Example | Shelf life test | Print results[a] |
|---|---|---|
| Comparative 2 | Plates stored for 5 days at 40° C. and 80% r.h. exhibit good developability; Photospeed shows little change compared to fresh plates | Plate shows strong wear in solid areas |
| Comparative 3 | After 5 days storage at 40° C. and 80% r.h., the photopolymer layer could not completely be removed by the developer in the unexposed areas; Scumming was observed in image free areas during printing | Plate shows only little wear |
| Comparative 4 | After 5 days storage at 40° C. and 80% r.h., the photopolymer layer could not completely be removed by the developer in the unexposed areas; Scumming was observed in image free areas during printing | Plate shows wear in solid areas |
| Comparative 5 | After 5 days storage at 40° C. and 80% r.h., the photopolymer layer could not completely be removed by the developer in the unexposed areas; Scumming was observed in image free areas during printing | Plate shows only little wear |
| Comparative 6 | After 5 days storage at 40° C. and 80% r.h., the photopolymer layer could not completely be removed by the developer in the unexposed areas; Scumming was observed in image free areas during printing | Plate shows strong wear in solid areas |
| Comparative 7 | After 5 days storage at 40° C. and 80% r.h., the photopolymer layer could not completely be removed by the developer in the unexposed areas; Scumming was observed in image free areas during printing | Plate shows only little wear |

[a]After 120,000 copies.

Examples 1–3, the printing plate precursors that comprise compositions of the invention, show high photospeed, good resolution, sufficient shelf life and acceptable press durability. Comparative Examples 1 to 7, in which the photosensitive compositions contain other sensitizers, produce plates that are inferior in at least one parameter (photospeed, resolution, shelf life, or press durability) compared to the Examples of the invention.

Having described the invention, we now claim the following and their equivalents.

What is claimed is:

1. A photosensitive composition comprising:

at least one ethylenically unsaturated monomer capable of free radical initiated addition polymerization; and a photoinitiator system comprising a coinitiator and a sensitizer;

in which:
the photoinitiator system is present in an amount sufficient to initiate polymerization of the at least one monomer on exposure to actinic radiation;
the sensitizer has an absorption maximum in the range of 400 nm to 700 nm; and
the sensitizer is a cyanopyridone derivative selected from the group consisting of compounds of Formula I, Formula II, Formula III, Formula IV, and Formula V,

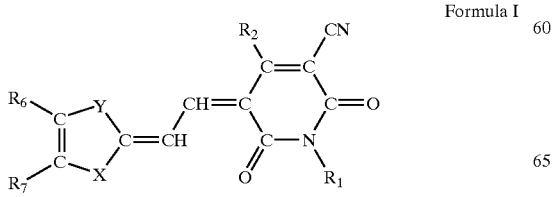

Formula I

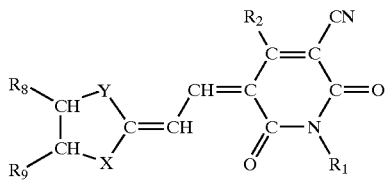

Formula II

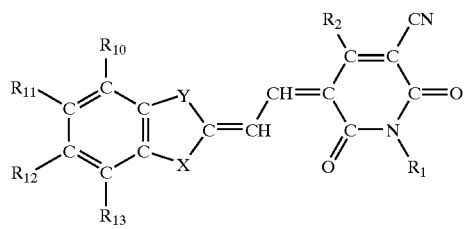

Formula III

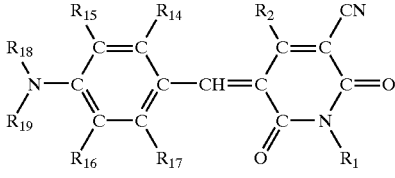

Formula IV

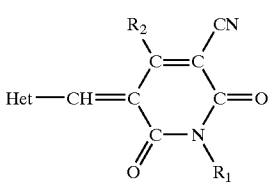

Formula V in which:

$R_1$ and $R_2$ are each independently hydrogen, or a substituted or unsubstituted alkyl, aryl or aralkyl group;

X is S or $N(R_3)$;

Y is O, S, Se, $N(R_3)$, or $C(R_4)(R_5)$, $R_3$, $R_4$, and $R_5$ are each independently a substituted or unsubstituted alkyl, aryl or aralkyl group;

$R_6$, $R_7$, $R_8$, and $R_9$ are each independently hydrogen, a substituted or unsubstituted saturated or unsaturated alkyl group, a substituted or unsubstituted aryl group, or a substituted or unsubstituted aralkyl group;

$R_{10}$, $R_{11}$, $R_{12}$, and $R_{13}$ are each independently hydrogen, a substituted or unsubstituted saturated or unsaturated alkyl group, a substituted or unsubstituted aryl group, or a substituted or unsubstituted aralkyl group, a substituted or unsubstituted amino group, a substituted or unsubstituted oxy group, or $R_{10}$ and $R_{11}$, $R_{11}$, and $R_{12}$, or $R_{12}$ and $R_{13}$ are joined to form a 5- or 6-membered substituted or unsubstituted ring;

$R_{14}$, $R_{15}$, $R_{16}$, and $R_{17}$ are each independently hydrogen, a substituted or unsubstituted alkyl group, a substituted or unsubstituted aryl group, a substituted or unsubstituted aralkyl group, halogen, carbalkoxy, a substituted or unsubstituted amino group, a substituted or unsubstituted oxy group, or $R_{14}$ and $R_{15}$, or $R_{16}$ and $R_{17}$ are joined to form a 5- or 6-membered substituted or unsubstituted ring;

$R_{18}$ and $R_{19}$ are each independently hydrogen, or a substituted or unsubstituted saturated or unsaturated alkyl group, a substituted or unsubstituted aryl group, or a substituted or unsubstituted aralkyl group, or $R_{18}$ and $R_{15}$ or $R_{19}$ and $R_{16}$ are joined to form a 5- or 6-membered substituted or unsubstituted ring, and Het is a 5- or 6-membered substituted or unsubstituted heterocyclic ring residue.

2. The composition of claim 1 in which the composition additionally comprises at least one binder.

3. The composition of claim 1 in which the coinitiator comprises a metallocene.

4. The composition of claim 3 in which the metallocene comprises four aromatic ligands and titanium or zirconium as the metal atom.

5. The composition of claim 1 in which the coinitiator comprises a metallocene and an onium salt in which the onium cation is an iodonium, sulphonium, phosphonium, oxysulphoxonium, oxysulphonium, sulphoxonium, ammonium, diazonium, selononium, or arsonium cation.

6. The composition of claim 5 in which the metallocene comprises four aromatic ligands and titanium or zirconium as the metal atom, and in which the onium cation is a diaryliodonium cation or a N-substituted N-heterocyclic onium cation in which N is substituted with a substituted or unsubstituted saturated or unsaturated alkyl or aryl group.

7. The composition of claim 6 in which the composition additionally comprises at least one binder.

8. The composition of claim 7 in which the composition comprises 10 to 60% of the one or more binders, 15 to 70% of the one or more monomers, and 0.1 to 12% of the photoinitiator system, based on the weight of the composition.

9. The composition of claim 8 in which the sensitizer is selected from the group consisting of compounds of Formula I, Formula II, and Formula III.

10. The composition of claim 9 in which the sensitizer is selected from the group consisting of:

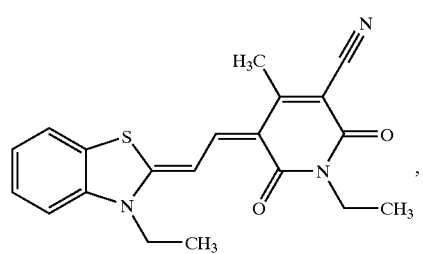

,

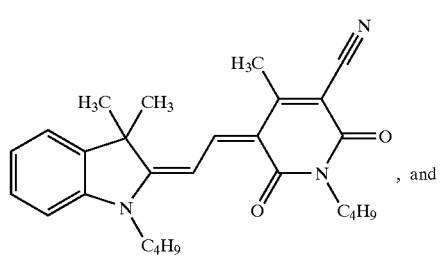

, and

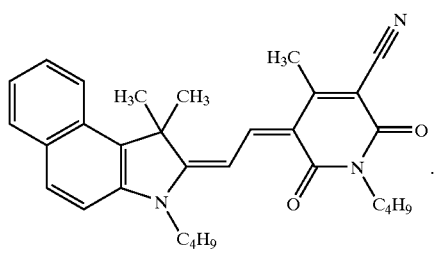

11. The composition of claim 1 in which:

$R_1$ and $R_2$ are each independently selected from the group consisting of unsubstituted saturated alkyl groups of 1 to 4 carbon atoms;

X is S or $N(R_3)$;

Y is O, S, $N(R_3)$, or $C(R_4)(R_5)$;

$R_3$, $R_4$, and $R_5$ are each independently selected from the group consisting of unsubstituted saturated alkyl groups of 1 to 4 carbon atoms;

$R_6$, $R_7$, $R_8$, and $R_9$ are each independently selected from the group consisting of hydrogen and unsubstituted saturated alkyl groups of 1 to 4 carbon atoms;

$R_{10}$, $R_{11}$, $R_{12}$, and $R_{13}$ each independently selected from the group consisting of hydrogen and unsubstituted saturated alkyl groups of 1 to 4 carbon atoms, or $R_{10}$ and $R_{11}$, $R_{11}$ and $R_{12}$, or $R_{12}$ and $R_{13}$ are joined to form a 6-membered substituted or unsubstituted aromatic ring;

$R_{14}$, $R_{15}$, $R_{16}$, and $R_{17}$ are each independently selected from the group consisting of hydrogen and unsubstituted saturated alkyl groups of 1 to 4 carbon atoms, or $R_{14}$ and $R_{15}$, or $R_{16}$ and $R_{17}$ are joined to form a 6-membered substituted or unsubstituted aromatic ring;

$R_{18}$ and $R_{19}$ each independently selected from the group consisting of hydrogen and unsubstituted saturated alkyl groups of 1 to 4 carbon atoms, or $R_{18}$ and $R_{15}$ or $R_{19}$ and $R_{16}$ are joined to form a 5- or 6-membered ring; and Het is a 5- or 6-membered heterocyclic ring residue selected from the group consisting of oxazolyl, benzoxazolyl, thiazolyl, imidazolyl, pyridyl, pyrazinyl, pyrimidinyl, pyridazinyl, furyl, pyrazolyl, chromanyl or cumaryl.

12. The composition of claim 11 in which the composition additionally comprises at least one binder.

13. The composition of claim 11 in which the coinitiator comprises a metallocene.

14. The composition of claim 13 in which the metallocene comprises four aromatic ligands and titanium or zirconium as the metal atom.

15. The composition of claim 11 in which the coinitiator comprises a metallocene and an onium salt in which the onium cation is iodonium, sulphonium, phosphonium, oxysulphoxonium, oxysulphonium, sulphoxonium, ammonium, diazonium, selononium, N-substituted N-heterocyclic onium, or arsonium.

16. The composition of claim 15 in which:

the metallocene comprises four aromatic ligands and titanium or zirconium as the metal atom;

two ligands are substituted or unsubstituted cyclopentadienyl groups and two ligands are substituted phenyl groups; and the onium cation is a diaryliodonium cation or an N-substituted N-heterocyclic onium cation in which N is substituted with a substituted or unsubstituted saturated or unsaturated alkyl or aryl group.

17. The composition of claim 16 in which the metallocene is selected from the group consisting of bis(cyclopentadienyl)-bis{2,6-difluoro-3-(pyrr-1-yl)-phenyl}-titanium, bis(cyclopentadienyl)-bis(pentafluorophenyl)-titanium, and dicyclopentadienyl-bis-pentafluorophenyl-zirconium.

18. The composition of claim 17 in which the composition additionally comprises at least one binder.

19. The composition of claim 17 in which the sensitizer is a compound of Formula I.

20. The composition of claim 17 in which the sensitizer is a compound of Formula II.

21. The composition of claim 17 in which the sensitizer is a compound of Formula III.

22. An imageable element comprising:
a support, and
a photosensitive layer over the support, the photosensitive layer comprising a photosensitive composition comprising:
at least one ethylenically unsaturated monomer capable of free radical initiated addition polymerization;
at least one binder, and
a photoinitiator system comprising a coinitiator and a sensitizer;
in which:
the photoinitiator system is present in an amount sufficient to initiate polymerization of the at least one monomer on exposure to actinic radiation:
the sensitizer has an absorption maximum in the range of 400 nm to 700 nm; and
the sensitizer is a cyanopyridone derivative selected from the group consisting of compounds of Formula I, Formula II, Formula III, Formula IV, and Formula V,

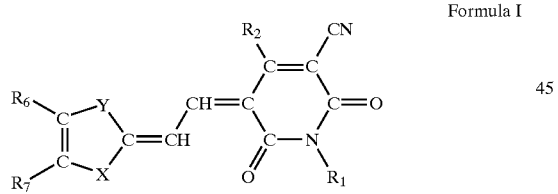

Formula I

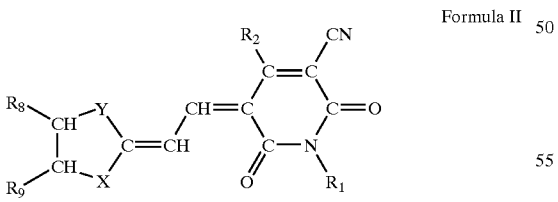

Formula II

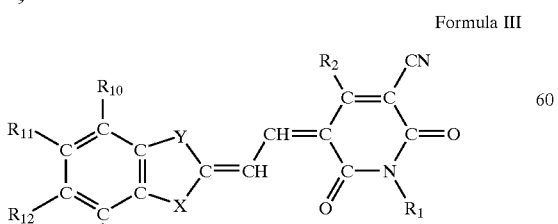

Formula III

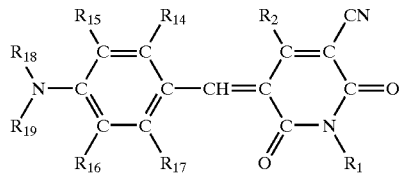

Formula IV

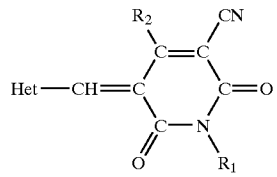

Formula V in which:
$R_1$ and $R_2$ are each independently hydrogen, or a substituted or unsubstituted alkyl, aryl or aralkyl group;
X is S or $N(R_3)$;
Y is O, S, Se, $N(R_3)$, or $C(R_4)(R_5)$,
$R_3$, $R_4$, and $R_5$ are each independently a substituted or unsubstituted-alkyl, aryl or aralkyl group;
$R_6$, $R_7$, $R_8$, and $R_9$ are each independently hydrogen, a substituted or unsubstituted saturated or unsaturated alkyl group, a substituted or unsubstituted aryl group, or a substituted or unsubstituted aralkyl group;
$R_{10}$, $R_{11}$, $R_{12}$, and $R_{13}$ are each independently hydrogen, a substituted or unsubstituted saturated or unsaturated alkyl group, a substituted or unsubstituted aryl group, or a substituted or unsubstituted aralkyl group, a substituted or unsubstituted amino group, a substituted or unsubstituted oxy group, or $R_{10}$ and $R_{11}$, $R_{11}$ and $R_{12}$, or $R_{12}$ and $R_{13}$ are joined to form a 5- or 6-membered substituted or unsubstituted ring;
$R_{14}$, $R_{15}$, $R_{16}$, and $R_{17}$ are each independently hydrogen, a substituted or unsubstituted alkyl group, a substituted or unsubstituted aryl group, a substituted or unsubstituted aralkyl group, halogen, carbalkoxy, a substituted or unsubstituted amino group, a substituted or unsubstituted oxy group, or $R_{14}$ and $R_{15}$, or $R_{16}$ and $R_{17}$ are joined to form a 5- or 6-membered substituted or unsubstituted ring;
$R_{18}$ and $R_{19}$ are each independently hydrogen, or a substituted or unsubstituted saturated or unsaturated alkyl group, a substituted or unsubstituted aryl group, or a substituted or unsubstituted aralkyl group, or $R_{18}$ and $R_{15}$ or $R_{19}$ and $R_{16}$ are joined to form a 5- or 6-membered substituted or unsubstituted ring, and
Het is a 5- or 6-membered substituted or unsubstituted heterocyclic ring residue.

23. The element of claim 22 in which:
the coinitiator comprises a metallocene and an onium salt;
the metallocene comprises four aromatic ligands and titanium or zirconium as the metal atom; and
the onium cation is an iodonium, sulphonium, phosphonium, oxysulphoxonium, oxysulphonium, sulphoxonium, ammonium, diazonium, selononium, or arsonium cation.

24. The element of claim 23 in which:
$R_1$ and $R_2$ are each independently selected from the group consisting of unsubstituted saturated alkyl groups of 1 to 4 carbon atoms;

X is S or N(R$_3$);

Y is O, S, N(R$_3$), or C(R$_4$)(R$_5$);

R$_3$, R$_4$, and R$_5$ are each independently selected from the group consisting unsubstituted saturated alkyl groups of 1 to 4 carbon atoms;

R$_6$, R$_7$, R$_8$, and R$_9$ are each independently selected from the group consisting of hydrogen and unsubstituted saturated alkyl groups of 1 to 4 carbon atoms;

R$_{10}$, R$_{11}$, R$_{12}$, and R$_{13}$ each independently selected from the group consisting of hydrogen and unsubstituted saturated alkyl groups of 1 to 4 carbon atoms, or R$_{10}$ and R$_{11}$, R$_{11}$ and R$_{12}$, or R$_{12}$ and R$_{13}$ are joined to form a 6-membered substituted or unsubstituted aromatic ring;

R$_{14}$, R$_{15}$, R$_{16}$, and R$_{17}$ are each independently selected from the group consisting of hydrogen and unsubstituted saturated alkyl groups of 1 to 4 carbon atoms, or R$_{14}$ and R$_{15}$, or R$_{16}$ and R$_{17}$ are joined to form a 6-membered substituted or unsubstituted aromatic ring;

R$_{18}$ and R$_{19}$ each independently selected from the group consisting of hydrogen and unsubstituted saturated alkyl groups of 1 to 4 carbon atoms, or R$_{18}$ and R$_{15}$ or R$_{19}$ and R$_{16}$ are joined to form a 5- or 6-membered ring; and Het is a 5- or 6-membered heterocyclic ring residue selected from the group consisting of oxazolyl, benzoxazolyl, thiazolyl, imidazolyl, pyridyl, pyrazinyl, pyrimidinyl, pyridazinyl, furyl, pyrazolyl, chromanyl or cumaryl.

25. The element of claim 24 in which the sensitizer is selected from the group consisting of compounds of Formula I, Formula II, and Formula III.

26. The element of claim 25 in which the metallocene is selected from the group consisting of bis(cyclopentadienyl)-bis{2,6-difluoro-3-(pyrr-1-yl)-phenyl}-titanium, bis(cyclopentadienyl)-bis(pentafluorophenyl)-titanium, and dicyclopentadienyl-bis-pentafluorophenyl-zirconium.

27. A method for forming an image, the method comprising the step of:

exposing a photosensitive element with radiation in the range of 400 nm to 700 nm;

in which the imageable element comprises:

a support, and a photosensitive layer over the support, the photosensitive layer comprising a photosensitive composition comprising:

at least one ethylenically unsaturated monomer capable of free radical initiated addition polymerization;

at least one binder, and a photoinitiator system comprising a coinitiator and a sensitizer;

in which:

the photoinitiator system is present in an amount sufficient to initiate polymerization of the at least one monomer on exposure to actinic radiation:

the sensitizer has an absorption maximum in the range of 400 nm to 700 nm; and the sensitizer is a cyanopyridone derivative selected from the group consisting of compounds of Formula I, Formula II, Formula III, Formula IV, and Formula V,

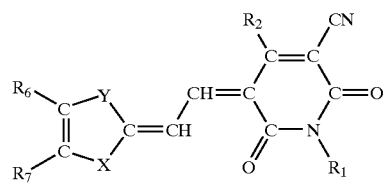

Formula I

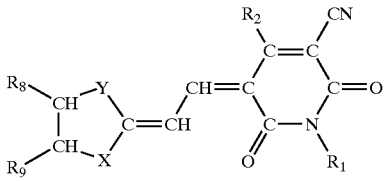

Formula II

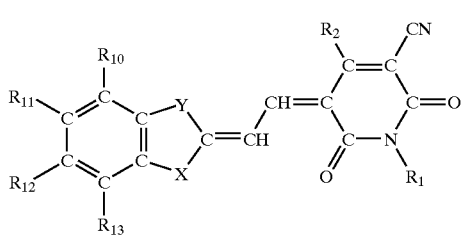

Formula III

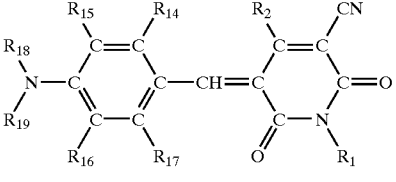

Formula IV

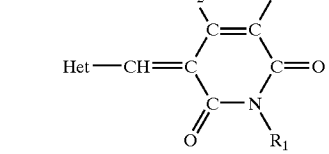

Formula V in which:

R$_1$ and R$_2$ are each independently hydrogen, or a substituted or unsubstituted alkyl, aryl or aralkyl group;

X is S or N(R$_3$);

Y is O, S, Se, N(R$_3$), or C(R$_4$)(R$_5$),

R$_3$, R$_4$, and R$_5$ are each independently a substituted or unsubstituted alkyl, aryl or aralkyl group;

R$_6$, R$_7$, R$_8$, and R$_9$ are each independently hydrogen, a substituted or unsubstituted saturated or unsaturated alkyl group, a substituted or unsubstituted aryl group, or a substituted or unsubstituted aralkyl group;

R$_{10}$, R$_{11}$, R$_{12}$, and R$_{13}$ are each independently hydrogen, a substituted or unsubstituted saturated or unsaturated alkyl group, a substituted or unsubstituted aryl group, or a substituted or unsubstituted aralkyl group, a substituted or unsubstituted amino group, a substituted or unsubstituted oxy group, or R$_{10}$ and R$_{11}$, R$_{11}$ and R$_{12}$, or R$_{12}$ and R$_{13}$ are joined to form a 5- or 6-membered substituted or unsubstituted ring;

R$_{14}$, R$_{15}$, R$_{16}$, and R$_{17}$ are each independently hydrogen, a substituted or unsubstituted alkyl group, a substituted or unsubstituted aryl group, a substituted or unsubstituted aralkyl group, halogen, carbalkoxy, a substituted or unsubstituted amino group, a substituted or unsubstituted oxy group, or $R_{14}$ and $R_{15}$, or $R_{16}$ and $R_{17}$ are joined to form a 5- or 6-membered substituted or unsubstituted ring;

$R_{18}$ and $R_{19}$ are each independently hydrogen, or a substituted or unsubstituted saturated or unsaturated alkyl group, a substituted or unsubstituted aryl group, or a substituted or unsubstituted aralkyl group, or $R_{18}$ and $R_{15}$ or $R_{19}$ and $R_{16}$ are joined to form a 5- or 6-membered substituted or unsubstituted ring, and Het is a 5- or 6-membered substituted or unsubstituted heterocyclic ring residue.

28. The method of claim 27 in which;

the coinitiator comprises a metallocene and an onium salt;

the metallocene comprises four aromatic ligands and titanium or zirconium as the metal atom;

the onium cation is an iodonium, sulphonium, phosphonium, oxysulphoxonium, oxysulphonium, sulphoxonium, ammonium, diazonium, selononium, or arsonium cation;

$R_1$ and $R_2$ are each independently selected from the group consisting of unsubstituted saturated alkyl groups of 1 to 4 carbon atoms;

X is S or $N(R_3)$;

Y is O, S, $N(R_3)$, or $C(R_4)(R_5)$;

$R_3$, $R_4$, and $R_5$ are each independently selected from the group consisting of unsubstituted saturated alkyl groups of 1 to 4 carbon atoms;

$R_6$, $R_7$, $R_8$, and $R_9$ are each independently selected from the group consisting of hydrogen and unsubstituted saturated alkyl groups of 1 to 4 carbon atoms;

$R_{10}$, $R_{11}$, $R_{12}$, and $R_{13}$ each independently selected from the group consisting of hydrogen and unsubstituted saturated alkyl groups of 1 to 4 carbon atoms, or $R_{10}$ and $R_{11}$, $R_{11}$ and $R_{12}$, or $R_{12}$ and $R_{13}$ are joined to form a 6-membered substituted or unsubstituted aromatic ring;

$R_{14}$, $R_{15}$, $R_{16}$, and $R_{17}$ are each independently selected from the group consisting of hydrogen and unsubstituted saturated alkyl groups of 1 to 4 carbon atoms, or $R_{14}$ and $R_{15}$, or $R_{16}$ and $R_{17}$ are joined to form a 6-membered substituted or unsubstituted aromatic ring;

$R_{18}$ and $R_{19}$ each independently selected from the group consisting of hydrogen and unsubstituted saturated alkyl groups of 1 to 4 carbon atoms, or $R_{18}$ and $R_{15}$ or $R_{19}$ and $R_{16}$ are joined to form a 5- or 6-membered ring; and Het is a 5- or 6-membered heterocyclic ring residue selected from the group consisting of oxazolyl, benzoxazolyl, thiazolyl, imidazolyl, pyridyl, pyrazinyl, pyrimidinyl, pyridazinyl, furyl, pyrazolyl, chromanyl or cumaryl.

29. The method of claim 28 in which the sensitizer is selected from the group consisting of compounds of Formula I, Formula II, and Formula III.

30. The method of claim 29 in which exposed and unexposed regions are formed in the photosensitive layer, and additionally comprising the step of developing the imageable element and removing the unexposed regions.

31. An image, the image prepared by a method comprising the step of:

exposing a photosensitive element with radiation in the range of 400 nm to 700 nm; in which the photosensitive element comprises:

a support, and a photosensitive layer over the support, the photosensitive layer comprising a photosensitive composition comprising:

at least one ethylenically unsaturated monomer capable of free radical initiated addition polymerization;

at least one binder, and a photoinitiator system comprising a coinitiator and a sensitizer;

in which:

the photoinitiator system is present in an amount sufficient to initiate polymerization of the at least one monomer on exposure to actinic radiation:

the sensitizer has an absorption maximum in the range of 400 nm to 700 nm; and the sensitizer is a cyanopyridone derivative selected from the group consisting of compounds of Formula I, Formula II, Formula III, Formula IV, and Formula V,

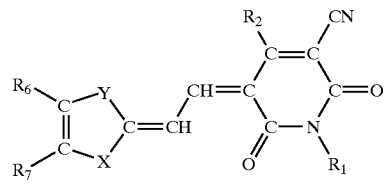

Formula I

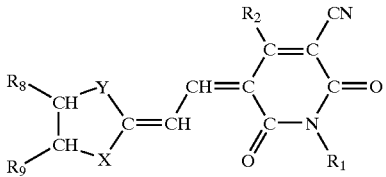

Formula II

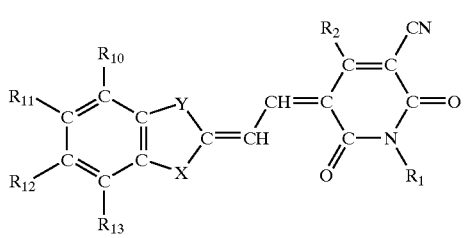

Formula III

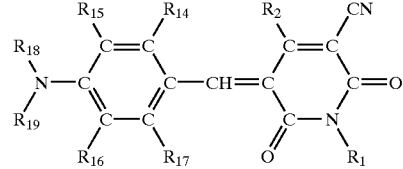

Formula IV

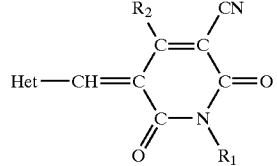

Formula V in which:

$R_1$ and $R_2$ are each independently hydrogen, or a substituted or unsubstituted alkyl, aryl or aralkyl group;

X is S or $N(R_3)$;

Y is O, S, Se, $N(R_3)$, or $C(R_4)(R_5)$, $R_3$, $R_4$, and $R_5$ are each independently a substituted or unsubstituted alkyl, aryl or aralkyl group;

$R_6$, $R_7$, $R_8$, and $R_9$ are each independently hydrogen, a substituted or unsubstituted saturated or unsaturated alkyl group, a substituted or unsubstituted aryl group, or a substituted or unsubstituted aralkyl group;

$R_{10}$, $R_{11}$, $R_{12}$, and $R_{13}$ are each independently hydrogen, a substituted or unsubstituted saturated or unsaturated alkyl group, a substituted or unsubstituted aryl group, or a substituted or unsubstituted aralkyl group, a substituted or unsubstituted amino group, a substituted or unsubstituted oxy group, or $R_{10}$ and $R_{11}$, $R_{11}$ and $R_{12}$, or $R_{12}$ and $R_{13}$ are joined to form a 5- or 6-membered substituted or unsubstituted ring;

$R_{14}$, $R_{15}$, $R_{16}$, and $R_{17}$ are each independently hydrogen, a substituted or unsubstituted alkyl group, a substituted or unsubstituted aryl group, a substituted or unsubstituted aralkyl group, halogen, carbalkoxy, a substituted or unsubstituted amino group, a substituted or unsubstituted oxy group, or $R_{14}$ and $R_{15}$, or $R_{16}$ and $R_{17}$ are joined to form a 5- or 6-membered substituted or unsubstituted ring;

$R_{18}$ and $R_{19}$ are each independently hydrogen, or a substituted or unsubstituted saturated or unsaturated alkyl group, a substituted or unsubstituted aryl group, or a substituted or unsubstituted aralkyl group, or $R_{18}$ and $R_{15}$ or $R_{19}$ and $R_{16}$ are joined to form a 5- or 6-membered substituted or unsubstituted ring, and Het is a 5- or 6-membered substituted or unsubstituted heterocyclic ring residue.

32. The image of claim 31 in which:

the coinitiator comprises a metallocene and an onium salt;

the metallocene comprises four aromatic ligands and titanium or zirconium as the metal atom;

the onium cation is an iodonium, sulphonium, phosphonium, oxysulphoxonium, oxysulphonium, sulphoxonium, ammonium, diazonium, selononium, or arsonium cation;

$R_1$ and $R_2$ are each independently selected from the group consisting of unsubstituted saturated alkyl groups of 1 to 4 carbon atoms;

X is S or $N(R_3)$;

Y is O, S, $N(R_3)$, or $C(R_4)(R_5)$;

$R_3$, $R_4$, and $R_5$ are each independently selected from the group consisting of unsubstituted saturated alkyl groups of 1 to 4 carbon atoms;

$R_6$, $R_7$, $R_8$ and $R_9$ are each independently selected from the group consisting of hydrogen and unsubstituted saturated alkyl groups of 1 to 4 carbon atoms;

$R_{10}$, $R_{11}$, $R_{12}$ and $R_{13}$ each independently selected from the group consisting of hydrogen and unsubstituted saturated alkyl groups of 1 to 4 carbon atoms, or $R_{10}$ and $R_{11}$, $R_{11}$ and $R_{12}$, or $R_{12}$ and $R_{13}$ are joined to form a 6-membered substituted or unsubstituted aromatic ring;

$R_{14}$, $R_{15}$, $R_{16}$ and $R_{17}$ are each independently selected from the group consisting of hydrogen and unsubstituted saturated alkyl groups of 1 to 4 carbon atoms, or $R_{14}$ and $R_{15}$, or $R_{16}$ and $R_{17}$ are joined to form a 6-membered substituted or unsubstituted aromatic ring;

$R_{18}$ and $R_{19}$ each independently selected from the group consisting of hydrogen and unsubstituted saturated alkyl groups of 1 to 4 carbon atoms, or $R_{18}$ and $R_{15}$ or $R_{19}$ and $R_{16}$ are joined to form a 5- or 6-membered ring; and Het is a 5- or 6-membered heterocyclic ring residue selected from the group consisting of oxazolyl, benzoxazolyl, thiazolyl, imidazolyl, pyridyl, pyrazinyl, pyrimidinyl, pyridazinyl, furyl, pyrazolyl, chromanyl or cumaryl.

33. The image of claim 32 in which the sensitizer is selected from the group consisting of compounds of Formula I, Formula II, and Formula III.

* * * * *

UNITED STATES PATENT AND TRADEMARK OFFICE
CERTIFICATE OF CORRECTION

PATENT NO. : 6,664,025 B2
DATED : December 16, 2003
INVENTOR(S) : Baumann et al.

It is certified that error appears in the above-identified patent and that said Letters Patent is hereby corrected as shown below:

Column 20,
Line 27, after "$R_{13}$" and before "each" insert -- are --
Line 39, after "$R_{19}$" and before "each" insert -- are --

Column 23,
Line 10, after "$R_{13}$" and before "each" insert -- are --
Line 22, after "$R_{19}$" and before "each" insert -- are --

Column 25,
Line 35, after "$R_{13}$" and before "each" insert -- are --
Line 46, after "$R_{19}$" and before "each" insert -- are --

Column 28,
Line 15, after "$R_{13}$" and before "each" insert -- are --
Line 26, after "$R_{19}$" and before "each" insert -- are --

Signed and Sealed this

Sixteenth Day of March, 2004

JON W. DUDAS
*Acting Director of the United States Patent and Trademark Office*